United States Patent [19]

Aoki

[11] Patent Number: 5,538,906
[45] Date of Patent: Jul. 23, 1996

[54] PROCESS FOR PRODUCING MASK ROM

[75] Inventor: Hitoshi Aoki, Nara, Japan

[73] Assignee: Sharp Kabushiki Kaisha, Osaka, Japan

[21] Appl. No.: 380,710

[22] Filed: Jan. 30, 1995

[30] Foreign Application Priority Data

Mar. 29, 1994 [JP] Japan .................. 6-058406

[51] Int. Cl.$^6$ ............................. H01L 21/8246
[52] U.S. Cl. ............... 437/29; 437/45; 437/982; 437/48; 148/DIG. 133
[58] Field of Search .............. 437/45, 48, 982, 437/29; 148/DIG. 133

[56] References Cited

U.S. PATENT DOCUMENTS

| | | | |
|---|---|---|---|
| 4,212,684 | 7/1980 | Brower | 437/45 |
| 4,224,089 | 9/1980 | Nishimoto et al. | 437/982 |
| 4,358,889 | 11/1982 | Dickman et al. | 437/45 |
| 4,633,572 | 1/1987 | Rusch et al. | 437/45 |
| 5,169,797 | 12/1992 | Kanebako et al. | 437/45 |
| 5,214,303 | 6/1993 | Aoki | 257/390 |
| 5,329,148 | 7/1994 | Aoki | 257/390 |
| 5,409,858 | 4/1995 | Thakur et al. | 148/DIG. 133 |
| 5,449,640 | 9/1995 | Hunt et al. | 437/195 |

FOREIGN PATENT DOCUMENTS

| | | | |
|---|---|---|---|
| 3026218 | 2/1982 | Germany | 437/45 |
| 55-21192 | 2/1980 | Japan | 437/982 |
| 55-34443 | 10/1980 | Japan . | |
| 60-28263 | 5/1985 | Japan . | |
| 60-241259 | 11/1985 | Japan | 437/48 |
| 61-166156 | 7/1986 | Japan . | |
| 61-147550 | 7/1986 | Japan | 437/982 |
| 2-224226 | 9/1990 | Japan | 437/982 |
| 4-256360 | 9/1992 | Japan . | |
| 4-48776 | 11/1992 | Japan . | |
| 59-68964 | 3/1994 | Japan . | |
| 6-151779 | 5/1994 | Japan . | |

OTHER PUBLICATIONS

W. Kern, et al, Electrochem. Soc. Meeting, 1988 Proceedings, p. 333. "Deposition Processes for BPSG Films".
Translation of JP-60-241259.
Translation of JP-61-166156.
Translation of JP 4-48776.
S. Wolf + R.N. Tauber, "Silicon Processing for the VLSI Era", vol. I, 1986, p. 221–223, 228–230, 303–305.
S. Wolf, "Silicon Processing For The VLSI Era" vol. II, 1992, p. 107–9.

*Primary Examiner*—Tom Thomas
*Assistant Examiner*—Leon Radomsky
*Attorney, Agent, or Firm*—Nixon & Vanderhye

[57] ABSTRACT

A process for producing a semiconductor device, comprising the steps of: (i) forming a transistor having a gate electrode, channel region and source/drain regions on a semiconductor substrate, followed by forming an interlayer insulation film on the entire semiconductor substrate including the transistor; (ii) forming a contact hole extending to either of the gate electrode and each of source/drain regions in the interlayer insulation film on the gate electrode or source/drain regions of the transistor; (iii) forming a resist mask having an opening above the channel region of the transistor on the interlayer insulation film, and implanting ions into the channel region by using the resist mask to write data; (iv) annealing the entire semiconductor substrate at a temperature of about 700° C. to about 800° C. in an atmosphere of an inert gas; and (v) forming a wiring.

4 Claims, 14 Drawing Sheets

PROCESS FOR PRODUCING MASK ROM

BACKGROUND OF THE INVENTION

1. Field of the Invention

The present invention relates to a process for producing a semiconductor device having a mask programmable ROM (hereinafter referred to as "mask ROM") portion, and more particularly to a process for producing a semiconductor device which provides the step of writing data to the mask ROM portion at the latter stage thereof while enabling the crystalline structure of a semiconductor substrate to be satisfactorily recovered from crystal defect generated therein.

2. Description of the Prior Art

In MOS transistors for use in a mask ROM for data storage, the thresholds of the channel regions below the gate electrodes are all set to the same predetermined value before data writing. Thereafter, a predetermined ion such as boron (B) or phosphorus (P) is implanted selectively into the channel regions of the MOS transistors to change the thresholds thereof in accordance with data to be stored, thereby achieving data writing.

More specifically, by raising the thresholds of the MOS transistors, the MOS transistors which would otherwise be in the ON state can be turned OFF for data writing. Data writing can otherwise be achieved by lowering the thresholds of transistors to change the type of the transistors from the enhancement-type to the depletion-type.

A turnaround time from customer order to shipment of semiconductor devices can be greatly shortened, since the step of the data writing by ion-implantation is provided at the latter stage in the semiconductor device production process. Semiconductor device production processes in which the ion-implantation step is provided after the wiring step are disclosed in Japanese Unexamined Patent Publications No. 55-34443 (1980), No. 59-68964 (1984) and No. 60-28263 (1985).

An example of conventional process for producing a semiconductor device having a mask ROM will hereinafter be described.

As shown in FIG. 20, an LOGOS oxide film 32 for device isolation is formed on a semiconductor substrate 31, followed by the formation of a gate oxide film 33 having a thickness of about 50 angstrom to about 300 angstrom. In turn, a gate electrode 34 is formed on the gate oxide film 33. To form source/drain regions 35 in the semiconductor substrate 31, an impurity ion of the conductivity type opposite to that of the semiconductor substrate 31 is implanted into the semiconductor substrate 31 from the gate electrode side. Thus, a memory transistor is completed. Thereafter, an interlayer insulation film 36 comprising a lower layer of NGS film and an upper layer of BPSG film is formed, and then contact holes are formed as extending through the interlayer insulation film 36 by etching with use of a mask for contact hole formation.

Subsequently, as shown in FIG. 21, a wiring material such as of Al or Al alloy is deposited on the interlayer insulation film 36 including the contact holes, and then patterned into a metal wiring 37 of a desired pattern.

In turn, as shown in FIG. 22, a resist pattern 38 is formed on the semiconductor substrate 31 by using a mask for ROM data writing, and boron ion is implanted into a channel region 39 of the memory-cell transistor. To activate the ion thus implanted, the entire semiconductor substrate is annealed at a temperature of about 450° C. to about 500° C., followed by the formation of a protection film (not shown). Thus, the semiconductor device is completed.

In another conventional production process, a gate electrode 44 and source/drain regions 45 are first formed on a semiconductor substrate 41, and then ROM data is written by ion-implantation with a portion other than the channel region being masked with a resist 46, as shown in FIG. 23.

In the former conventional production processes, however, the annealing process for the activation of the implanted ion is carried out at a temperature of not higher than the melting point (660° C.) of the metal wiring material of Al, for example, at a temperature of about 500° C. This is because the annealing process is performed after the formation of the metal-wiring 37. As a result, crystal defects generated in the semiconductor substrate 31 during the ion-implantation step cannot sufficiently be remedied and, in addition, the ion is not activated enough. In order to attain a desired threshold voltage, it is required to increase the dose of ion-implantation in compensation for the low ion activation. However, this causes junction leakage and the increase of diffusion resistance of the source/drain regions, thereby deteriorating the circuit characteristics.

In still another conventional production process, the activation of the implanted ion is ameliorated by raising the effective annealing temperature with use of such a special annealing method as a laser annealing, electron beam annealing or lamp annealing instead of the aforesaid low temperature annealing (at about 500° C.). However, this process suffers a very low productivity and requires expensive production equipment.

In Japanese Unexamined Patent Publications No. 61-166156 (1986) and No. 4-48778 (1992), there is disclosed a semiconductor device production process in which the ROM data writing is carried out after the formation of the contact hole and before the formation of the metal wiring to solve the aforesaid problems. If the ion-implantation and annealing for ion activation are carried out before the formation of the metal wiring, the annealing temperature can be set higher, thereby eliminating such a problem as the deterioration of the circuit characteristics resulting from the low annealing temperature (below 500° C.). If the high temperature annealing is carried out after the contact hole formation, however, such ions as boron or phosphorus are autodoped to the contact portion on the semiconductor substrate from the interlayer insulation film (e.g., of BPSG). This will lead to an increase in the contact resistance or to a non-linear resistance characteristic, thereby resulting in a contact failure.

Further, where the ROM data writing is carried out after the formation of memory-cell transistor as shown in FIG. 23, the data writing step is followed by a long process sequence. Therefore, such a production process is unsuitable for the fast delivery of semiconductor devices.

SUMMARY OF THE INVENTION

In accordance with the present invention, there is provided a process for producing a semiconductor device comprising the steps of: (i) forming a transistor having a gate electrode, channel region and source/drain regions on a semiconductor substrate, followed by forming an interlayer insulation film on the entire semiconductor substrate including the transistor; (ii) forming a contact hole extending to either of the gate electrode or each of source/drain regions in the interlayer insulation film on the gate electrode or source/drain regions of the transistor; (iii) forming a resist mask having an opening above the channel region of the transistor on the interlayer insulation film, and implanting ions into the channel region by using the resist mask to write data; (iv) annealing the entire semiconductor substrate at a temperature of about 700° C. to about 800° C. in an atmosphere of an inert gas; and (v) forming a wiring.

DETAILED DESCRIPTION OF THE PREFERRED EMBODIMENT

Figure 1:
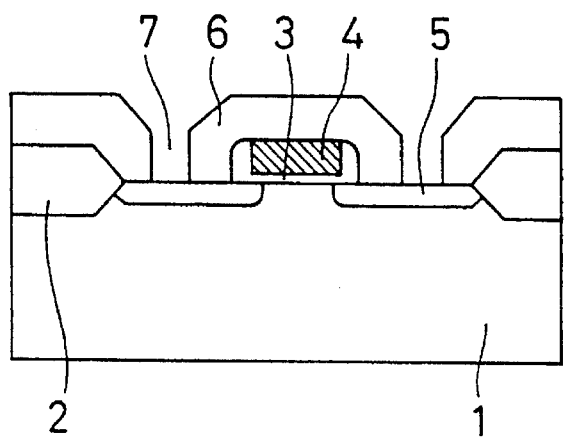
FIGS. 1 to 3 are schematic sectional views for explaining a process for producing a semiconductor device having a mask ROM in accordance with EMBODIMENT 1 of the present invention.

In a process for producing a semiconductor device in accordance with the present invention, it is preferable to use a silicon substrate as a semiconductor substrate, but not limited thereto. Preferably, the semiconductor substrate is preliminarily doped with an N-type or P-type impurity. Examples of the N-type impurity include phosphorus and arsenic ions, and examples of the P-type impurity include boron ions. Also preferably, the semiconductor substrate is preliminarily formed with device isolation films by a conventional method as LOCOS. A gate insulation film such as of $SiO_2$ or SiN is formed on the semiconductor substrate by a conventional method as CVD or thermal oxidation process. The thickness of the gate insulation film is preferably about 50 angstrom to about 300 angstrom, more preferably about 100 angstrom to about 200 angstrom.

In step (i), a transistor is formed on the semiconductor substrate, and then an interlayer insulation film is formed on the entire semiconductor substrate including the transistor. In the formation of the transistor, a gate electrode may be first formed on the semiconductor substrate, and then source/drain regions are formed by implanting ions into the semiconductor substrate with use of the gate electrode as a mask. Alternatively, the source/drain regions may be formed by implanting ions into desired portions of the semiconductor substrate, followed by the formation of the gate electrode on the semiconductor substrate. Exemplary materials of the gate electrode include a single layer of polysilicon or a silicide of high-melting-point metal such as Ti, Ta or W, and a stacked later such as of a polycide of the silicide and polysilicon. The gate electrode is preferably deposited to a thickness of about 1000 angstrom to about 5000 angstrom in a conventional method such as CVD or sputtering. The source/drain regions can be formed along with a channel region by implanting impurity ion of the conductivity type opposite to that of the semiconductor substrate and then annealing the entire semiconductor substrate. At this time, the impurity ion is preferably implanted at an energy of about 30KeV to about 100KeV in a dose of about $1\times10^{14}\text{cm}^{-2}$ to about $5\times10^{15}\text{cm}^{-2}$, more preferably in a dose of the order of $1\times10^{15}\text{cm}^{-2}$. The gate electrode may optionally be provided with a side wall spacer or covered with an insulation film. Where the source/drain regions are formed before the formation of the gate electrode, a resist of a desired pattern may first be formed on the semiconductor substrate by way of photolithography, and then the impurity ion of the conductivity type opposite to that of the semiconductor substrate may be implanted into the semiconductor substrate. An interlayer insulation film to be formed on the transistor thus fabricated may be of a single layer or multilayer of BPSG, PSG or the like having a thickness of about 4000 angstrom to about 8000 angstrom. Where the gate insulation film has a thickness of about 100 angstrom to about 200 angstrom and the gate electrode has a thickness of about 3500 angstrom, the interlayer film on the gate electrode after BPSG is melted preferably has a thickness of less than about 5000 angstrom, so that production apparatus of a relatively high productivity can be utilized which requires a lower ion-implantation energy and realizes a production process of a relatively high productivity. The heat treatment for melting BPSG is carried out at a temperature of about 850° C. to about 950° C. for about 10 minutes to about 60 minutes.

In step (ii), a contact hole is formed as extending through the interlayer insulation film either to the gate electrode or to each of the source/drain regions, so that part of the surface of the gate electrode or each of the source/drain regions is exposed in the contact hole. The contact hole can be formed not only within the memory cell but also outside the memory cell. The diameter of the contact hole may vary depending on the size of the transistor, the material of the wiring and the conditions of the heat treatment in the production process.

In step (iii), data is written in the transistor. First, a resist is applied onto the entire semiconductor substrate with an opening being formed above the channel region of the transistor to which data is to be written. In turn, impurity ion of the same conductivity type as that of the semiconductor substrate is implanted into the channel region by using the resist as a mask. Where the semiconductor substrate is of P-type, for example, $^{11}B^+$ or $^{11}B^{++}$ ion may be implanted at an energy of about 300KeV to about 500KeV. The impurity ion is implanted preferably in a dose of about $5\times10^{13}cm^{-2}$ to about $5\times10^{14}cm^{-2}$ more preferably about $1\times10^{14}cm^{-2}$ to about $3\times10^{14}cm^{-2}$. Where the semiconductor substrate is of N-type, P ion may be implanted preferably at an energy of about 1000KeV to about 1500KeV in a dose of about $5\times10^{13}cm^{-2}$ to about $5\times10^{14}cm^{-2}$.

Figure 8:
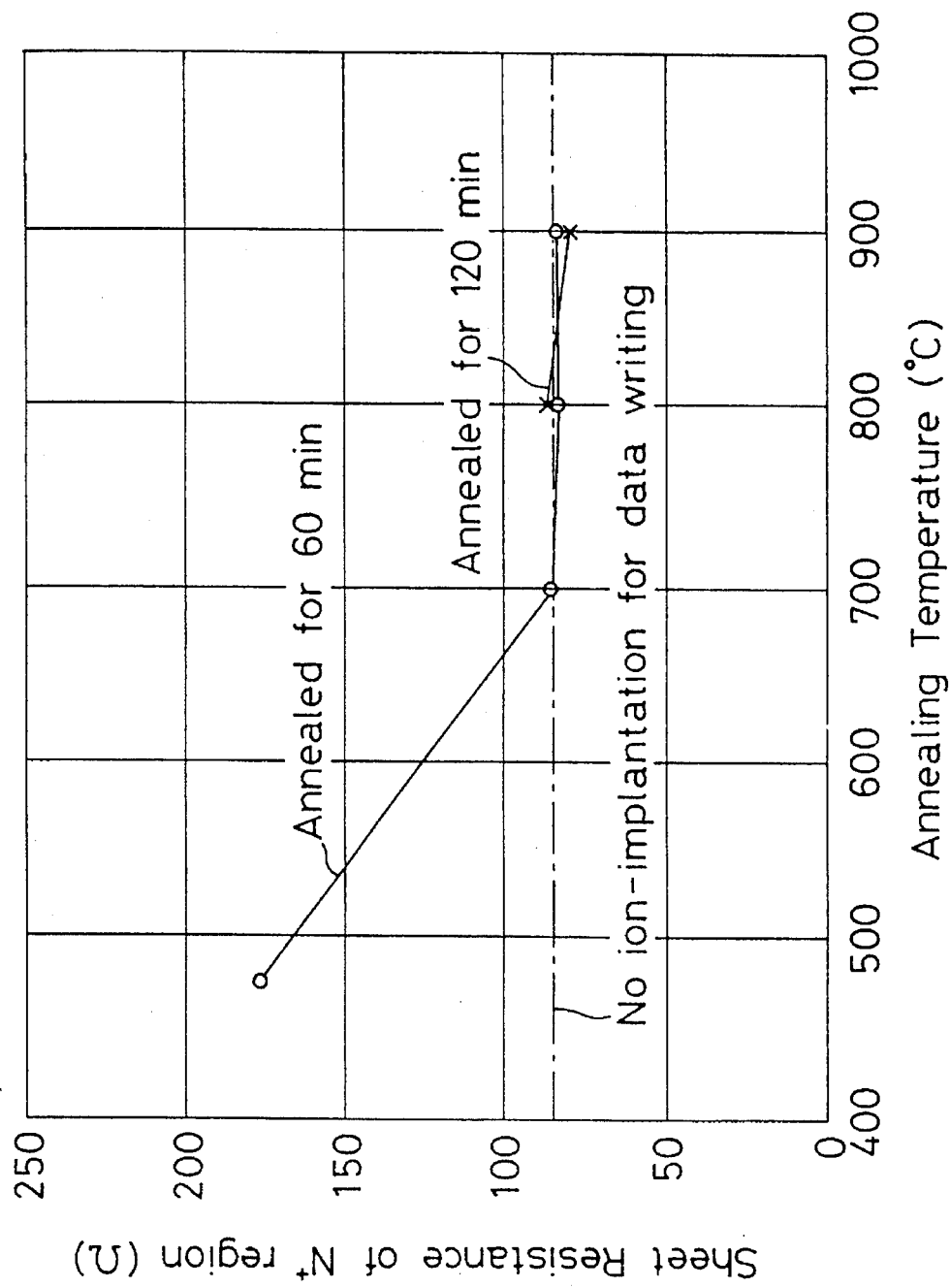
FIG. 8 is a graphical representation illustrating the relationship between the annealing temperature and $N^+$ region sheet resistance of a memory-cell transistor implanted with ion for ROM data writing.
Figure 9:
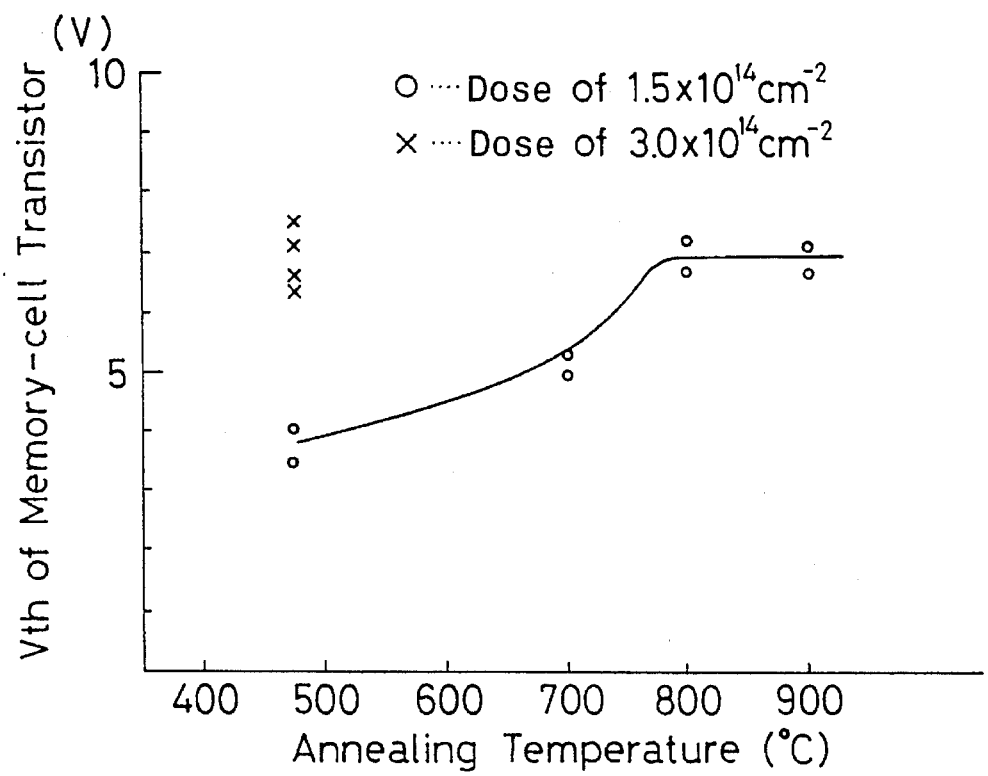
FIG. 9 is a graphical representation illustrating the relationship between the annealing temperature and the threshold voltage of a memory-cell transistor implanted with ion for ROM data writing.
Figure 10:
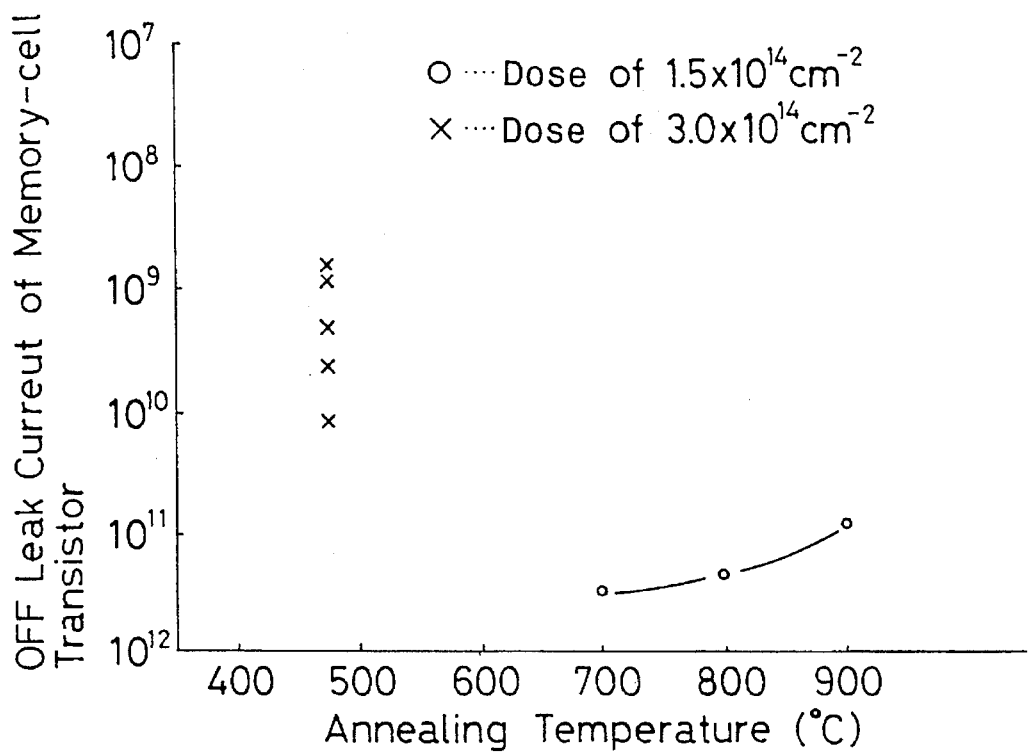
FIG. 10 is a graphical representation illustrating the relationship between the annealing temperature and the off-leak current of a memory-cell transistor implanted with ion for ROM data writing.
Figure 11:
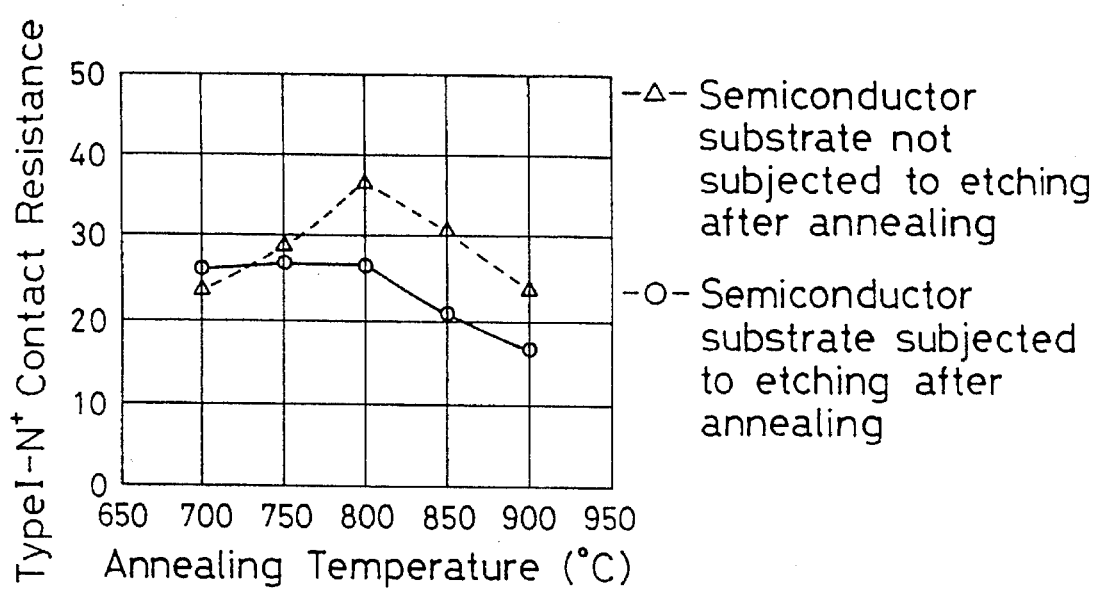
FIG. 11 is a graphical representation illustrating the relationship between the annealing temperature and the contact resistance on an $N^+$ diffusion layer.
Figure 13:
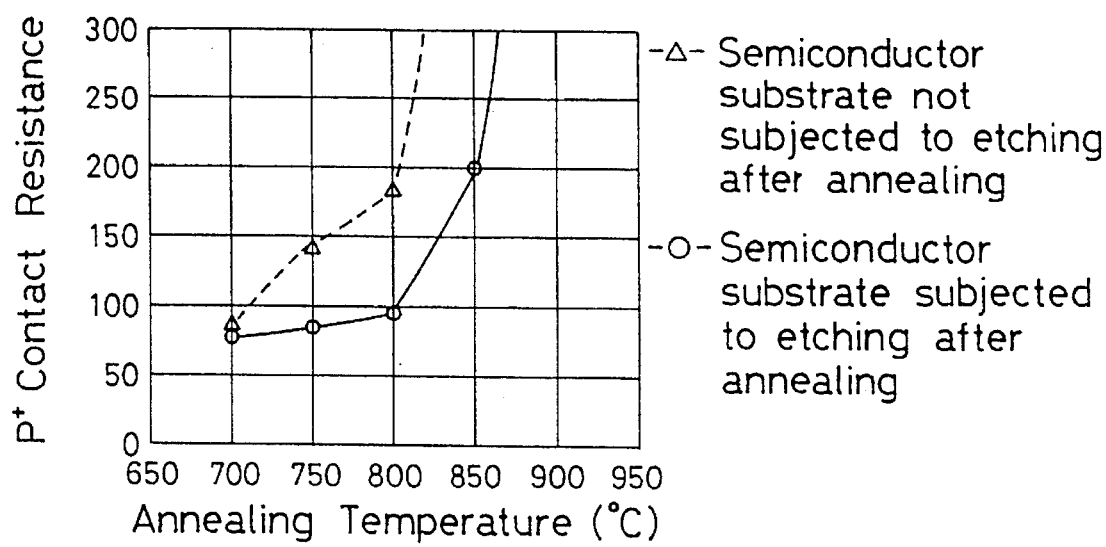
FIG. 13 is a graphical representation illustrating the relationship between the annealing temperature and the contact resistance on a $P^+$ diffusion layer.
Figure 14:
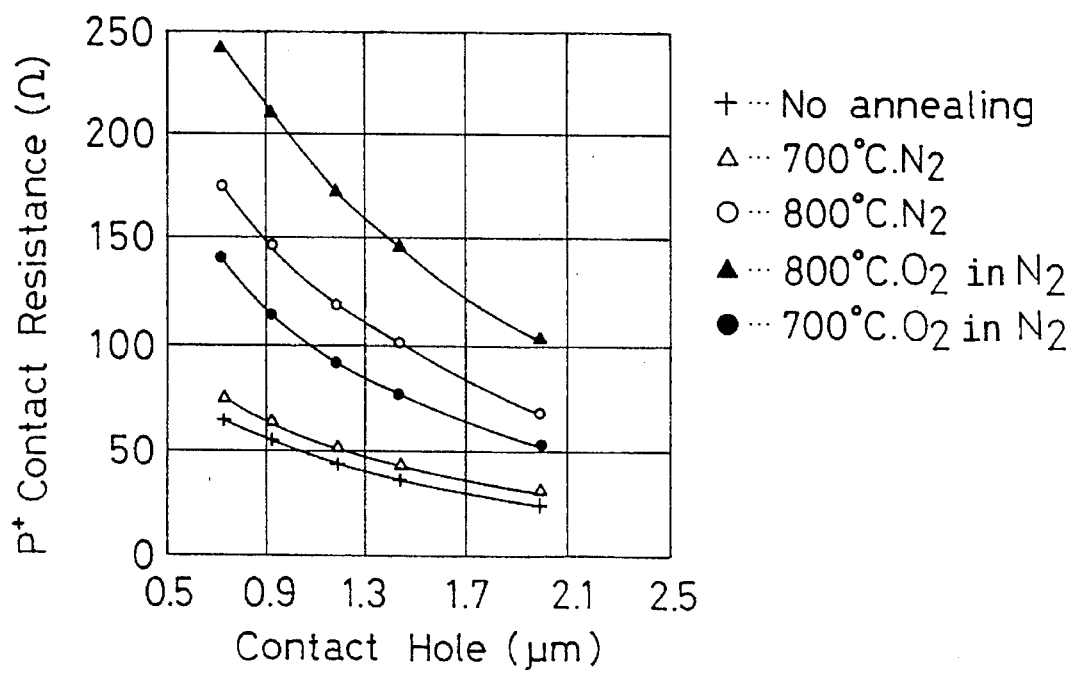
FIG. 14 is a graphical representation illustrating the relationship between the diameter of a contact hole and the contact resistance on the $P^+$ diffusion layer.
Figure 15:
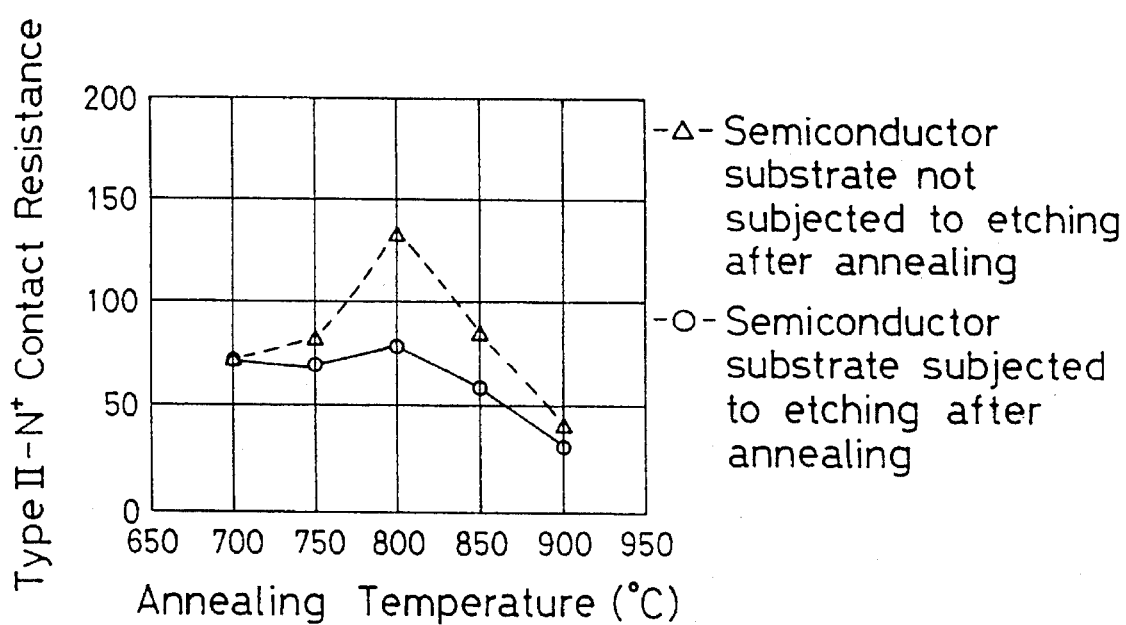
FIG. 15 is a graphical representation illustrating the relationship between the annealing temperature and the contact resistance on another $N^+$ diffusion layer having a unction profile different from that shown in FIG. 11.

In step (iv), the entire semiconductor substrate is annealed for the activation of the implanted ion. The annealing is carried out in an atmosphere of such an inert gas as nitrogen, argon or helium at a temperature of about 700° C. to 800° C. for about 10 minutes to 120 minutes in an electric furnace or the like. If the contact hole is formed as extending to each of the source/drain regions in the step (ii), the surface of each of the source/drain regions of the semiconductor substrate exposed in the contact hole may be etched to such an extent as to improve contact characteristics.

Where N-type source/drain regions ($N^+$ diffusion layer) are formed in the P-type semiconductor substrate, the sheet resistance of the $N^+$ source/drain regions gradually increases as the annealing temperature is lowered from 700° C., as shown in FIG. 8. As may be understood from FIG. 9, sufficient activation of the implanted ion can be achieved at a temperature of higher than 700° C. and attained a desired threshold voltage, thereby reducing the dose of the ion to be implanted. Further, as shown in FIG. 10, the junction leak at the source/drain regions is reduced by annealing at a temperature of higher than 700° C. Therefore, the lower limit of the annealing temperature is preferably about 700° C.

Where N-type source/drain regions are formed in the P-type semiconductor substrate, a type I-$N^+$ contact is made between an $N^+$ diffusion layer and a wiring which is formed in a later step. If the annealing is carried out at a temperature of higher than 800° C. in this case, the type I-$N^+$ contact may be influenced by the autodoping of the impurity ion from the interlayer insulation film, as shown by dotted line in FIG. 11. Where P-type source/drain regions are formed, on the other hand, a $P^+$ contact is made between $P^+$ diffusion layer and a wiring. If the annealing temperature is higher than 800° C. in this case, the contact resistance is steeply increased, so that a non-linear resistance characteristic is observed, as shown by dotted line in FIG. 13. Where N-type source/drain regions are formed before the formation of the gate electrode, a type II-$N^+$ contact is made between the $N^+$ diffusion layer and a wiring. If the annealing temperature is higher than 800° C. in this case, the type II-$N^+$ contact may be influenced by the autodoping like the type I-$N^+$ contact, as shown by dotted line in FIG. 15. Further, where a portion of the semiconductor substrate exposed in the contact hole is etched by a thickness of about 200 angstrom after the annealing, the contact resistances of the type I-$N^+$ contact, $P^+$ contact and type II-$N^+$ contact are made substantially constant within the annealing temperature range of between about 700° C. and about 800° C., as shown by solid lines in FIGS. 11, 13 and 15. If the annealing temperature is set to 850° C., the contact resistances of the type I-$N^+$ contact and type II-$N^+$ contact are reduced, while the contact resistance of the $P^+$ contact is steeply increased to exhibit a non-linear resistance characteristic. This means that the influence of the autodoping still exists. Therefore, the upper limit of the annealing temperature is preferably 800° C. FIGS. 11, 13 and 15 show the relationship between the annealing temperature and the contact resistance which was measured when a contact hole with a diameter of about 0.8 μm and source/drain regions doped with impurity ion in a dose of about $2\times10^{15}cm^{-2}$ to about $5\times10^{15}cm^{-2}$ was annealed in an atmosphere of nitrogen gas for about 60 minutes. Though the degree of an increase in the contact resistance dependent to the annealing temperature varies depending on the process conditions, such an increase in the contact resistance can be controlled by, for example, increasing the diameter of the contact hole, as shown in FIGS. 12 and 14.

Figure 12:
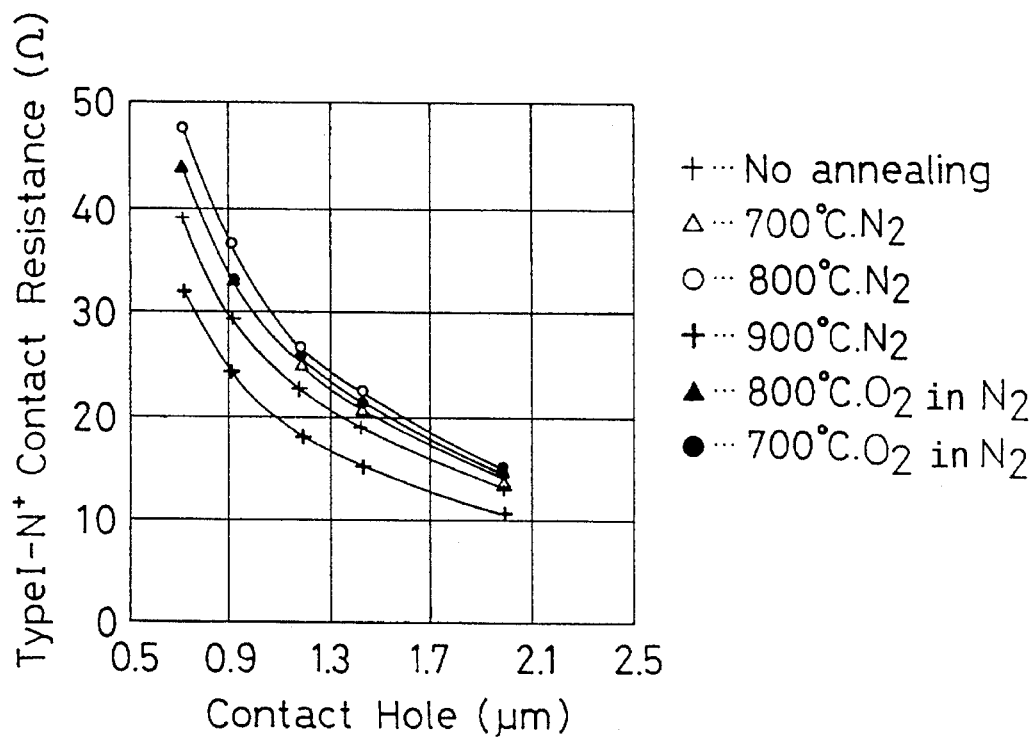
FIG. 12 is a graphical representation illustrating the relationship between the diameter of a contact hole and the contact resistance on the $N^+$ diffusion layer.

Further, where the semiconductor substrate to which data has been written by ion-implantation is annealed in an atmosphere of oxygen gas, the contact resistance of the type I-$N^+$ contact tends to be slightly decreased as shown in FIG. 12, compared with the case where the semiconductor substrate is annealed in the atmosphere of nitrogen gas at the same annealing temperature. However, the contact resistance of the $P^+$ contact is undesirably increased, compared with the case where the semiconductor substrate is annealed in the atmosphere of nitrogen at the same annealing temperature. This is because boron ion is drawn out of the surface of the $P^+$ contact. Therefore, the atmosphere of an inert gas is more suitable for the annealing.

By etching the surface of the semiconductor substrate exposed to the contact hole after the annealing, a portion of the semiconductor substrate which has an irregular impurity concentration due to the autodoping and has been damaged by the etching for the formation of the contact hole can be removed. Therefore, the semiconductor device thus fabricated exhibits a more stable contact characteristic. Exemplary etching methods include a plasma etching (but not limited thereto) which can selectively etch and remove only the semiconductor substrate without etching the interlayer insulation film. The etching depth may vary depending on such conditions as the impurity concentration of the interlayer insulation film, the implantation energy and dose of the ion for the formation of the source/drain regions and the annealing temperature. Therefore, the most suitable etching depth is preferably determined by the conditions of the production process. That is, a preferable etching depth is such that a portion of the surface of the semiconductor substrate (the surface of the source/drain regions) which has an irregular impurity concentration due to the autodoping can be sufficiently removed by the etching, while the etching depth is sufficiently shallow relative to the diffusion depth of the source/drain regions so as not to adversely affect the junction characteristic thereof.

Figure 16:
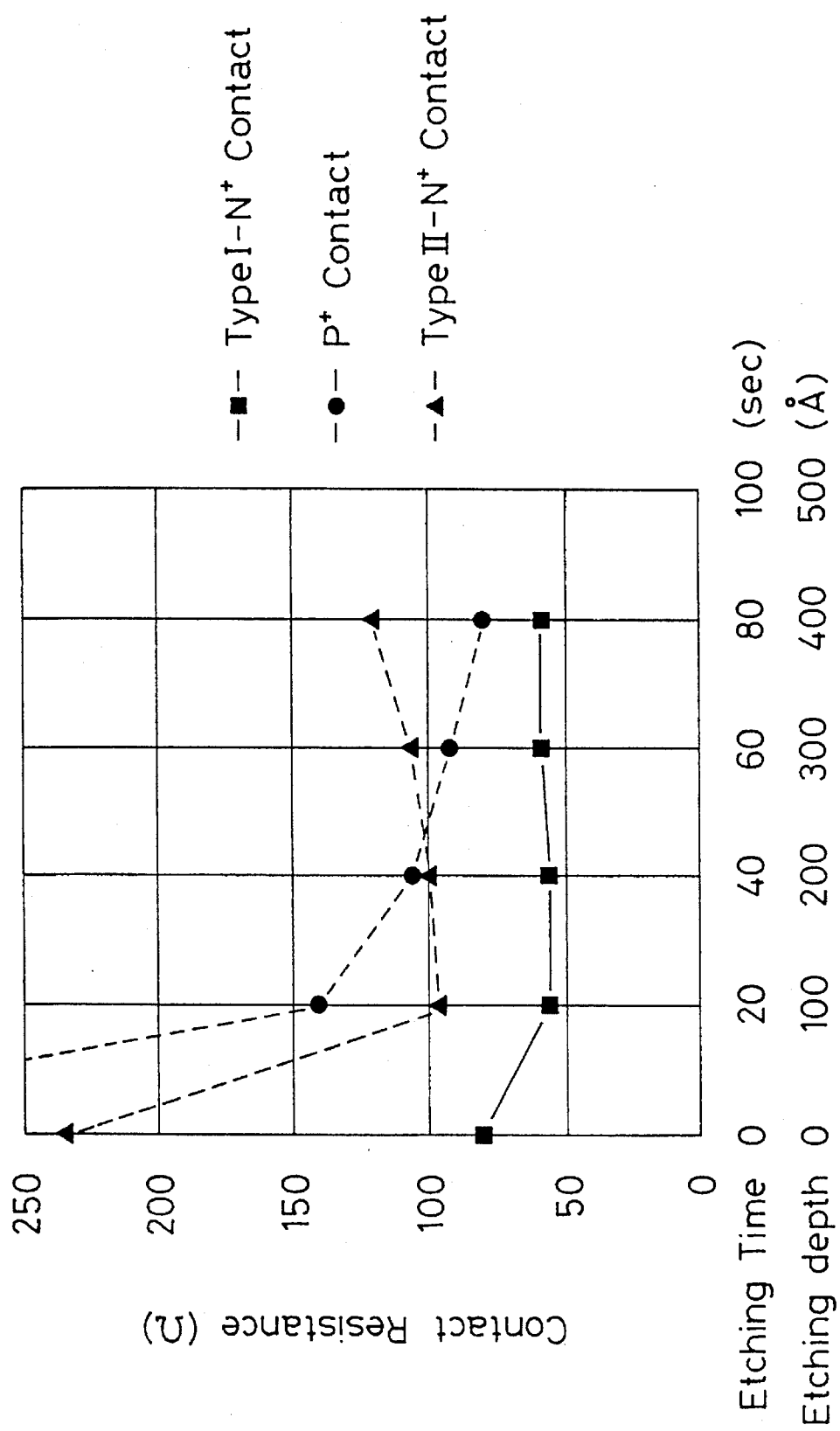
FIG. 16 is a graphical representation illustrating the relationship between the contact resistance and the etching time (etching depth)
Figure 17:
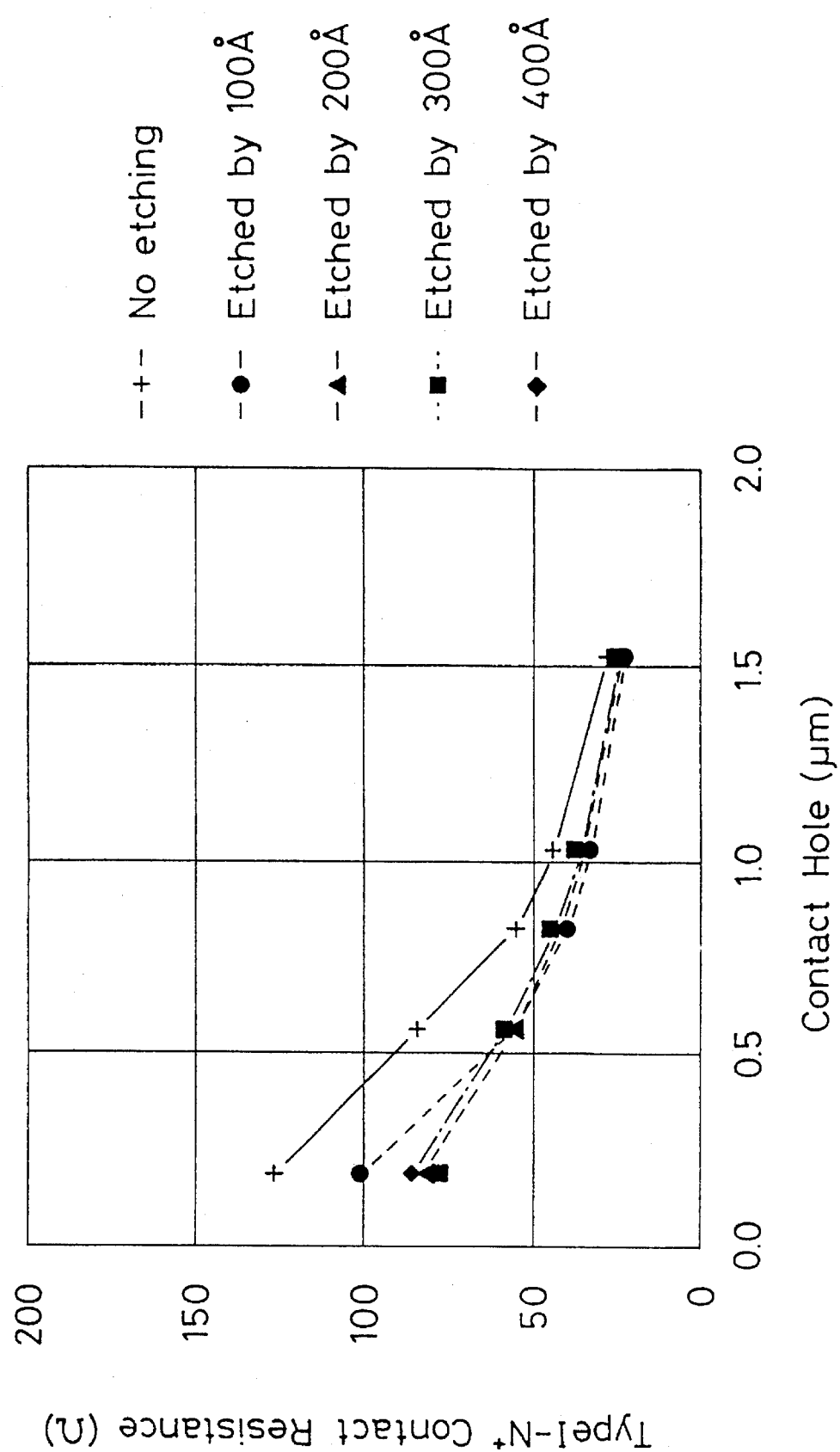
FIG. 17 is a graphical representation illustrating the relationship between the diameter of a contact hole and the contact resistance on an $N^+$ diffusion layer.
Figure 18:
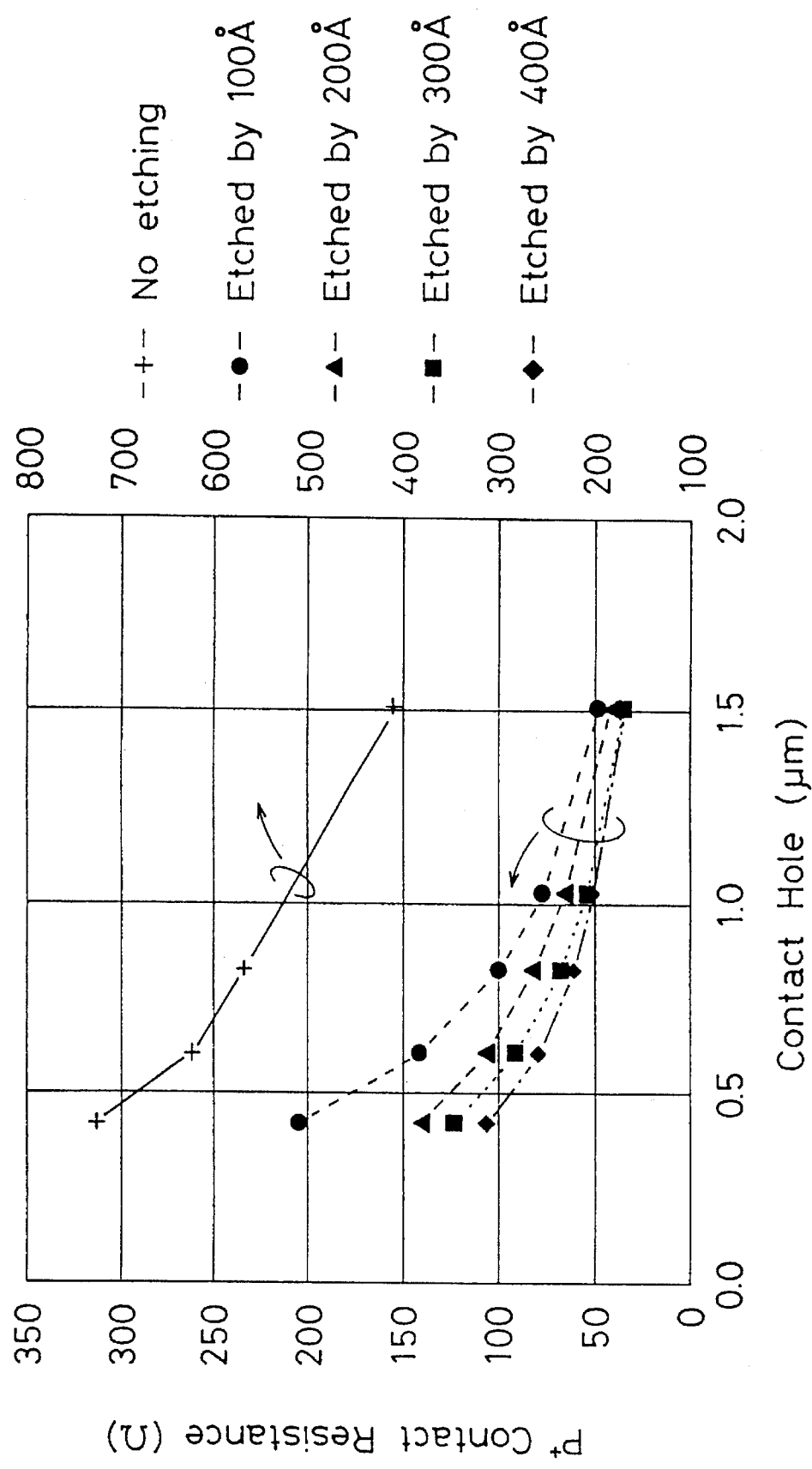
FIG. 18 is a graphical representation illustrating the relationship between the diameter of a contact hole and the contact resistance on a $P^+$ diffusion layer.
Figure 19:
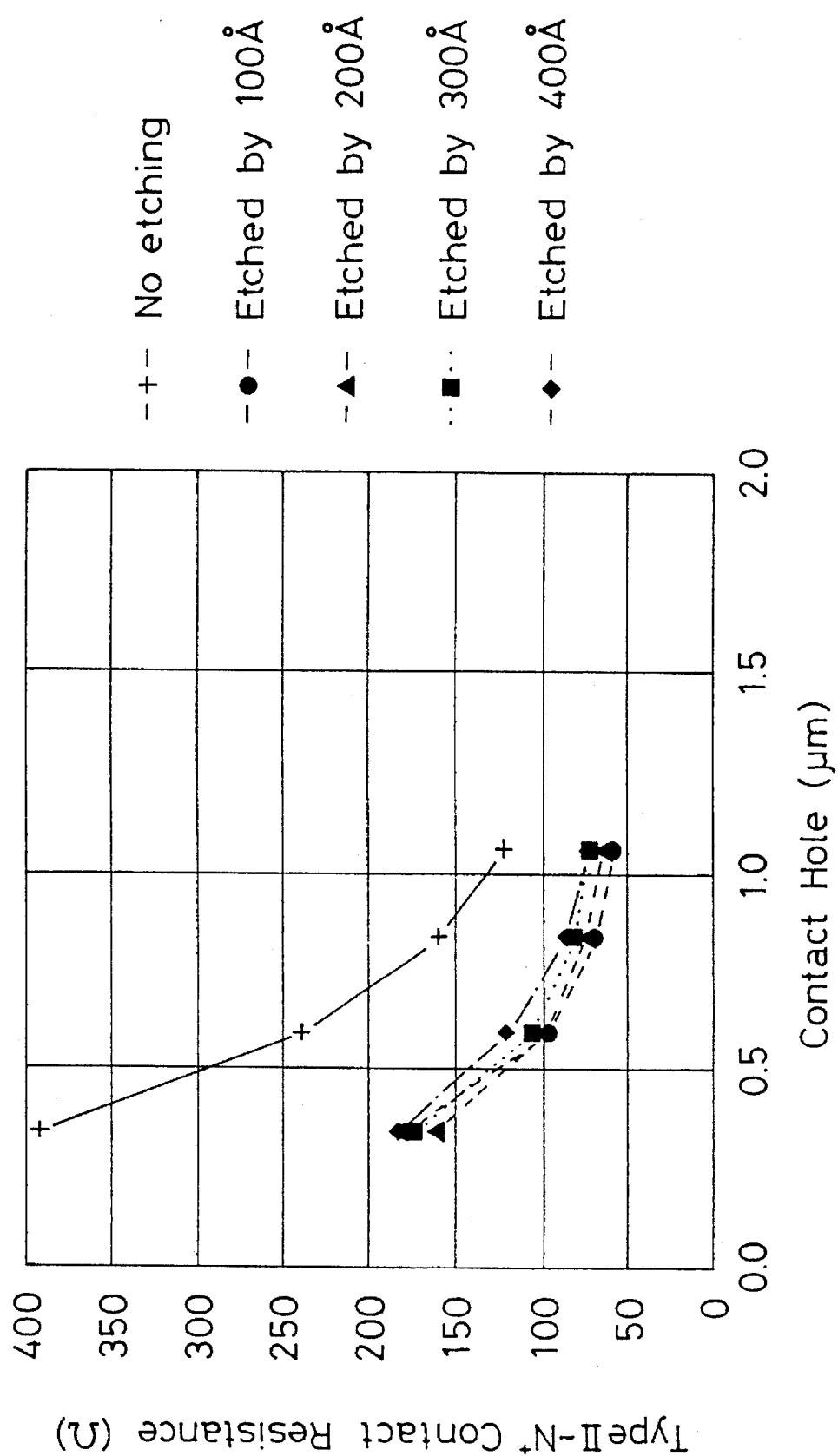
FIG. 19 is a graphical representation illustrating the relationship between the diameter of a contact hole and the contact resistance on another $N^+$ diffusion layer having a junction profile different from that shown in FIG. 17.
Figure 20:
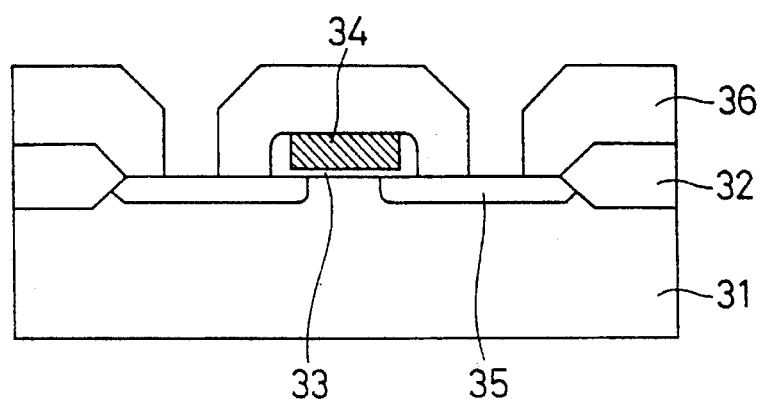
FIGS. 20 to 22 are schematic sectional views illustrating a conventional process for producing a semiconductor device.
Figure 21:
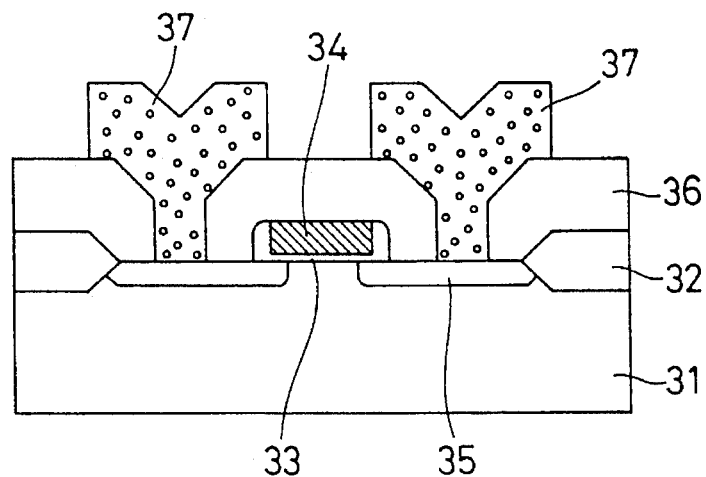
Figure 22:
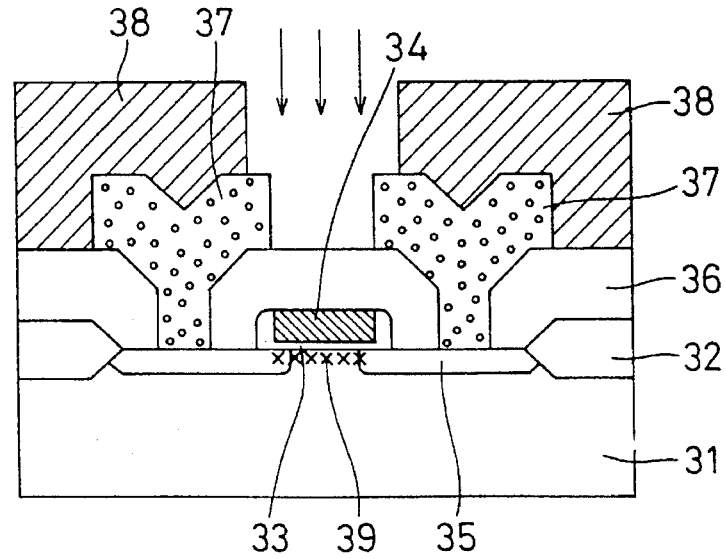
Figure 23:
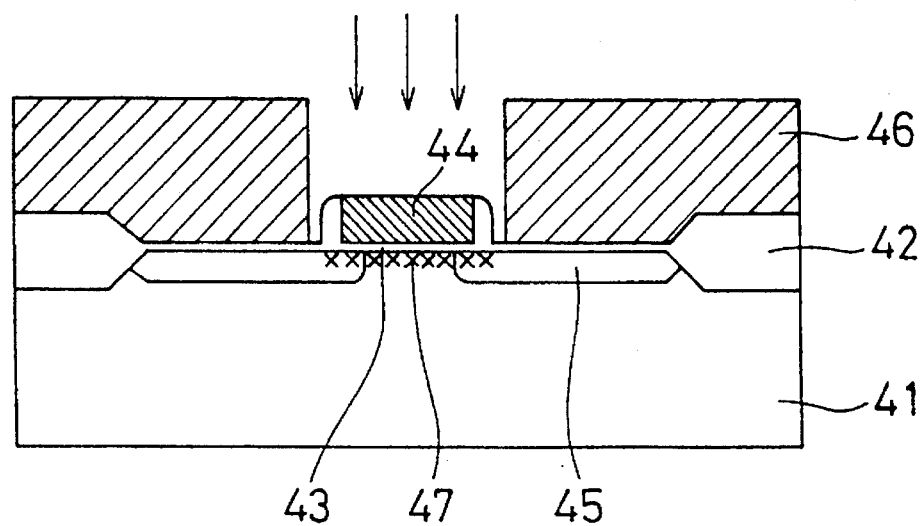
FIG. 23 is a schematic sectional view illustrating another conventional process for producing a semiconductor device.

FIG. 16 shows the relationship between the contact resistance and the etching time (or etching depth) which was observed when semiconductor substrates respectively having a contact (type I-N$^+$ contact) with a diameter of 0.56 μm, a contact (P$^+$ contact) with a diameter of 0.60 μm and a contact (type II-N$^+$ contact) with a diameter of 0.59 μm and having source/drain regions implanted with impurity ion at an implantation energy of 40KeV in a dose of $3\times10^{15}$cm$^{-2}$ were etched after being annealed in an atmosphere of nitrogen gas at a temperature of 800° C. for 60 minutes. As shown in FIG. 16, the contact resistance observed when the surface of the semiconductor substrate was etched by about 100 angstrom is lower than that observed when no etching was carried out. FIG. 17 shows the relationship between the contact resistance of the type I-N$^+$ contact and the contact hole. As shown in FIG. 17, the contact resistances respectively observed in case that the etching depths are about 100 angstrom, 200 angstrom, 300 angstrom and 400 angstrom are substantially the same when the contact hole diameter is 0.75±0.1 μm (which is employed in this production process). Further, FIG. 18 shows the relationship between the contact resistance of the P$^+$ contact and the contact hole. As shown in FIG. 18, the contact resistances respectively observed in case that the etching depths are about 100 angstrom, 200 angstrom, 300 angstrom and 400 angstrom are substantially the same when the contact hole diameter is 0.75±0.1 μm (which is employed in this production process). Further, FIG. 19 shows the relationship between the contact resistance of the type II-N$^+$ contact and the contact hole. As shown in FIG. 19, the contact resistances respectively observed in case that the etching depths are about 100 angstrom, 200 angstrom, 300 angstrom and 400 angstrom are substantially the same when the contact hole diameter is 0.75±0.1 μm (which is employed in the production process). Therefore, the etching depth is preferably about 100 to about 400 angstrom.

In step (v), the semiconductor device is completed by forming the wiring. The wiring is formed of a conductive material such as aluminum or aluminum alloy (Al—Si, Al—Cu or the like), which is typically employed as a wiring material, but not limited thereto. The wiring can be formed by sputtering, evaporation or a like method. Before the wiring is formed, an under layer may be formed of such a barrier metal as TiN, TiW or Ti, or the contact hole may be filled with a blanket material such as W. The transistor thus obtained is finished by coating with a protection film using any known method such as CVD.

The process for producing semiconductor device in accordance with the present invention is applicable to memory devices including one or more transistors to which data is to be written.

Processes for producing a semiconductor device will hereinafter be described by way of the following EMBODIMENTs 1 to 3.

EMBODIMENT 1

As shown in FIG. 1, an LOCOS oxide film 2 was formed on a P-type semiconductor substrate 1 for device isolation, and a gate oxide film 3 having a thickness of about 170 angstrom and a gate electrode 4 were successively formed on the semiconductor substrate 1. The gate electrode 4 had a two-layer structure comprising an N$^+$ poly-Si film (lower layer) with a thickness of about 1500 angstrom and a tungsten silicide film (upper layer) with a thickness of about 2000 angstrom. To form source/drain regions 5 in the semiconductor substrate 1, arsenic ion (As$^+$) which is of the conductivity type opposite to that of the semiconductor substrate 1 was implanted into the semiconductor substrate 1 in a dose of the order of $10^{15}$cm$^{-2}$ from the upper side of the gate electrode 4. Further, SiO$_2$ was deposited to a thickness of about 3000 angstrom, and a side wall spacer was formed on the side walls of the gate electrode 4 by way of anisotropic etching. In turn, an NGS film and BPSG film were successively deposited on the entire semiconductor substrate to form an interlayer insulation film 6 having a thickness of about 4000 angstrom. Then, contact holes 7 were formed as extending through the interlayer insulation film 6 to the source/drain regions 5 by way of photolithography.

Figure 2:
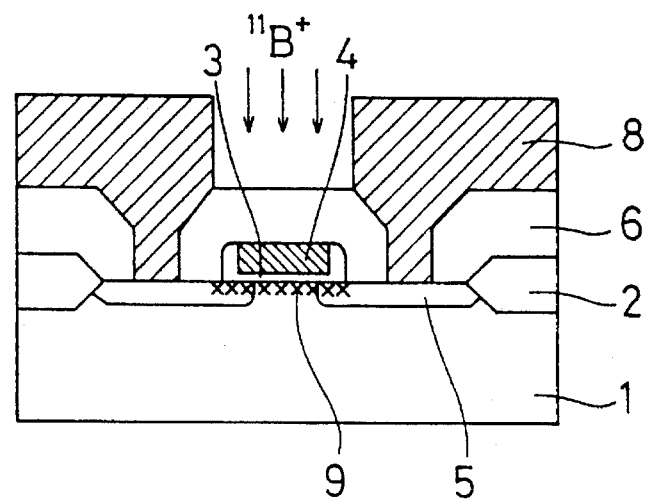

As shown in FIG. 2, a resist pattern was formed by using a mask for ROM data writing. Then, $^{11}$B$^+$ions were implanted into a channel region at an implantation energy of about 350KeV in a dose of about $1.5\times10^{14}$ ions/cm$^2$ by using the resist pattern 8 as a mask. To activate the implanted ions 9, the entire semiconductor substrate was annealed in an atmosphere of nitrogen gas at a temperature of about 800° C. for about 60 minutes in an electric furnace.

Figure 3:
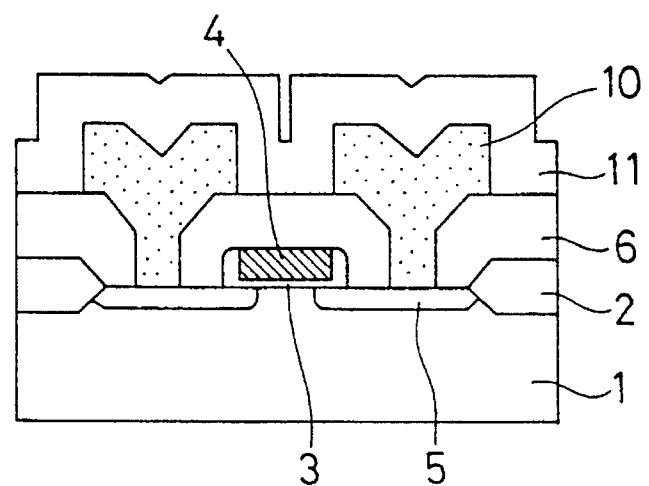

Thereafter, a metal wiring 10 was formed, and the entire semiconductor substrate was covered with a protection film 11, as shown in FIG. 3. Thus, the semiconductor device was completed.

Reference semiconductor devices were fabricated in substantially the same manner as the aforesaid process. In this case, the annealing temperature was variously set in a range of between 500° C. and 900° C., and the dose of $^{11}$B$^+$ions was $1.5\times10^{14}$ ions/cm$^2$ or $3.0\times10^{14}$ ions/cm$^2$. Then, the threshold voltages for writing data to the transistors of the respective semiconductor devices thus fabricated and the leak currents when the transistors were in the OFF state were measured. The relationships between the annealing temperature and the threshold voltage and between the annealing temperature and the OFF leak current are shown in FIGS. 9 and 10, respectively.

Further, reference semiconductor devices were fabricated in substantially the same manner as the aforesaid process. In this case, $^{11}$B$^+$ions were implanted into the channel region at an implantation energy of 350 KeV in a dose of $1.5\times10^{14}$ ions/cm$^2$, and the annealing temperature was vatiously set in a range of between about 500° C. and 900° C. Then, the sheet resistances of the source/drain regions of the respective semiconductor devices were measured. The relationship between the annealing temperature and the sheet resistance is shown in FIG. 8.

EMBODIMENT 2

An MOS transistor was formed on the P-type semiconductor substrate 11, and the ion-implantation into a channel region and the annealing were carried out for ROM data writing in substantially the same manner as described in EMBODIMENT 1.

Figure 4:
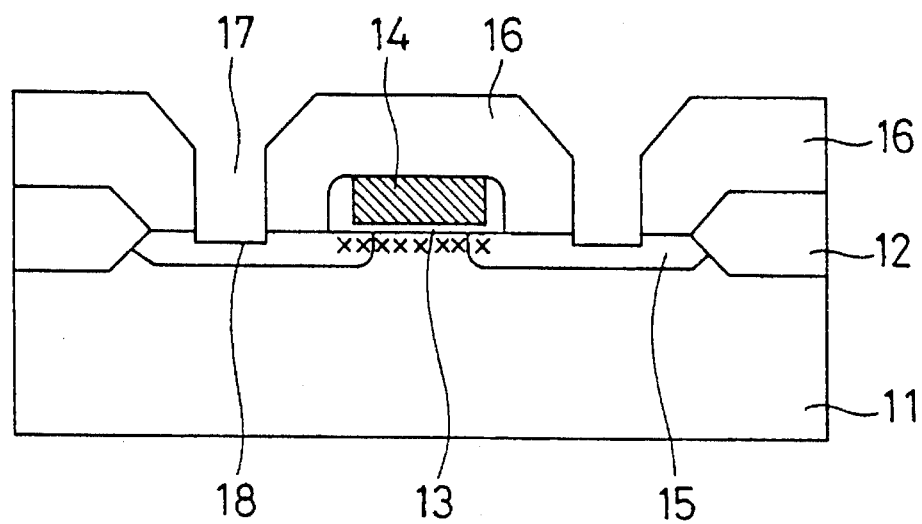
FIG. 4 is a schematic sectional view fop explaining a process for producing a semiconductor device having a mask ROM in accordance with EMBODIMENT 2 of the present invention.

As shown in FIG. 4, the upper surface 18 of source/drain regions 15 exposed in a contact hole 17 was etched and removed (by a depth of about 100 angstrom to about 500 angstrom from the surface thereof) by way of plasma etching. In this case, the source/drain regions 15 were formed by implanting As$^+$ ion at an energy of 40–80 KeV in a dose of the order of $10^{15}$cm$^{-2}$, and the junction depth was about 0.2 μm. This is why the preferable etching depth was about 100 angstrom to 500 angstrom.

Thereafter, a metal wiring and protection film were formed in substantially the same manner as described in EMBODIMENT 1. Thus, the semiconductor device was completed.

EMBODIMENT 3

Figure 5:
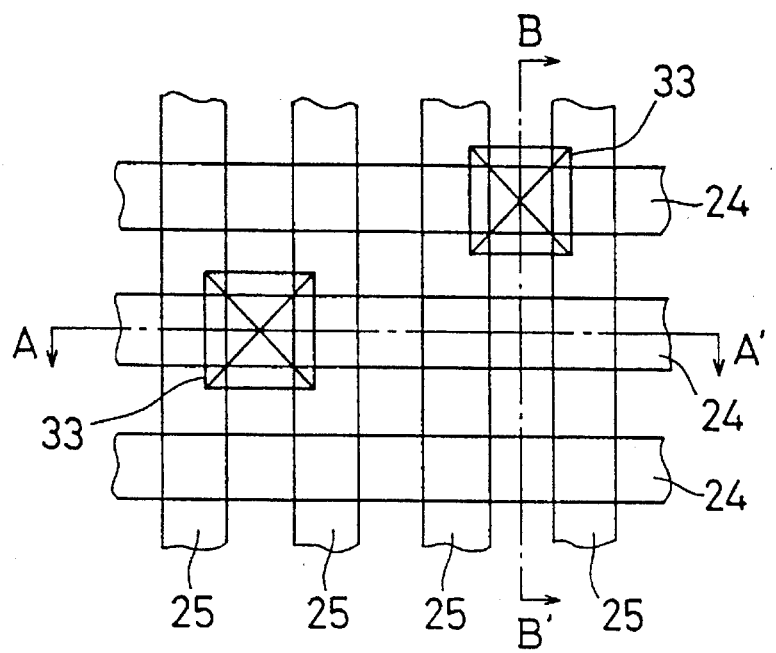
FIG. 5 is a schematic plan view for explaining a process for producing a semiconductor device having a mask ROM in accordance with EMBODIMENT 3 of the present invention.
Figure 6:
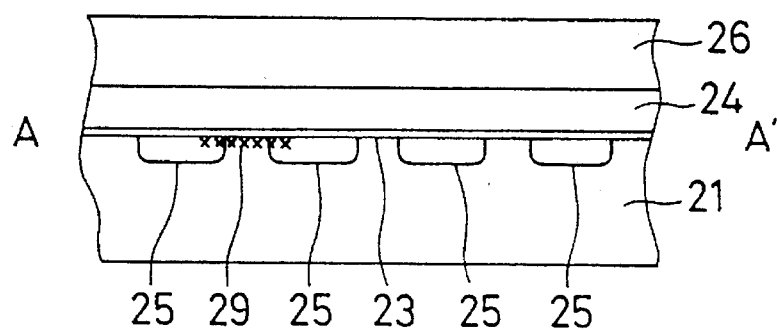
FIG. 6 is a sectional view taken along the line A–A' in FIG. 5.
Figure 7:
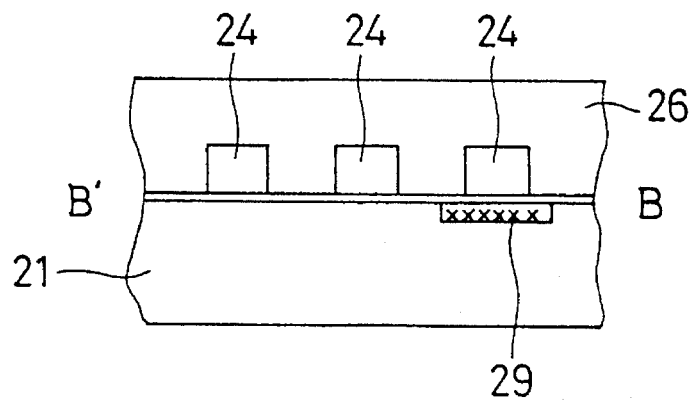
FIG. 7 is a sectional view taken along the line B–B' in FIG. 5.

As shown in FIGS. 5 to 7, a plurality of source/drain regions 25 were formed parallel to each other on a semiconductor substrate 21, and a plurality of gate electrodes 24 were formed perpendicular to the plurality of source/drain regions 25. Then, channel regions 29 were implanted with ions through the gate electrodes 24 by using a mask for ROM data writing designed for memory-cell transistors 33 to which data were to be written.

Thereafter, the entire semiconductor substrate was annealed, and an interlayer insulation film 26, metal wiring and a like were formed in substantially the same manner as described in EMBODIMENT 1. Thus, the semiconductor device was completed.

As can be understood from the foregoing, the ion-implantation is carried out before the formation of the wiring, and the annealing temperature is between about 700° C. and 800° C. in accordance with the semiconductor device production process of the present invention. This means that the ions implanted for ROM data writing can be activated by way of the annealing at a relatively high temperature. Therefore, crystal defects generated in the semiconductor substrate due to the ion-implantation can be satisfactorily remedied, and it is not necessary to increase the dose to attain a desired threshold voltage. Accordingly, the junction leak of the source/drain regions and the diffusion resistance can be reduced.

Further, in accordance with the semiconductor device production process of the present invention, the diffusion areas of the contact portions are etched to such an extent as not to adversely affect the junction characteristic before the formation of the wiring. That is, the areas in the source/drain regions which would possibly be affected by the autodoping in accordance with a conventional data writing process can be removed before the formation of the wiring. Therefore, the semiconductor device thus produced can have a stable contact characteristic.

What is claimed is:

1. A process for producing a semiconductor device, comprising the steps of:

(i) forming a transistor having a gate electrode, channel region and source/drain regions on a semiconductor substrate, followed by forming an interlayer insulation film on the entire semiconductor substrate including the transistor;

(ii) forming a contact hole extending to either of the source/drain regions in the interlayer insulation film on the source/drain regions of the transistor so as to expose a surface of the source/drain regions;

(iii) forming a resist mask having an opening above the channel region of the transistor on the interlayer insulation film, and implanting ions into the channel region at a dose of from $5\times10^{13}$cm$^{-2}$ to $5\times10^{14}$cm$^{-2}$ by using the resist mask to write data;

(iv) annealing the entire semiconductor substrate at a temperature of about 700° C. to less than 800° C. in an atmosphere of an inert gas; and thereafter (v) forming wiring on the semiconductor device.

2. A process of claim 1 wherein the annealing time is in the range of 10 to 120 minutes.

3. A process of claim 1 wherein the contact hole is formed as extending to each of the source/drain regions in the step (ii), and further comprising, after the step (iv), the step of etching the surface of each of the source/drain regions exposed in the contact hole.

4. A process of claim 3 wherein the surface of each of the source/drain regions exposed in the contact hole is etched by the thickness in the range of 100 to 400 angstrom.

* * * * *